(12) United States Patent
Lee

(10) Patent No.: US 7,586,790 B2
(45) Date of Patent: Sep. 8, 2009

(54) FLASH MEMORY DEVICE AND REFRESH METHOD

(75) Inventor: Jin-Yub Lee, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 149 days.

(21) Appl. No.: 11/842,995

(22) Filed: Aug. 22, 2007

(65) Prior Publication Data
US 2008/0055997 A1    Mar. 6, 2008

(30) Foreign Application Priority Data
Sep. 1, 2006    (KR) .................... 10-2006-0084263

(51) Int. Cl.
*G11C 16/04* (2006.01)
(52) U.S. Cl. ..................... 365/185.25; 365/189.05
(58) Field of Classification Search ............ 365/185.25, 365/189.05, 185.11, 185.24
See application file for complete search history.

(56) References Cited

U.S. PATENT DOCUMENTS

| | | | |
|---|---|---|---|
| 5,912,836 A | 6/1999 | Liu et al. | |
| 6,819,589 B1 | 11/2004 | Aakjer | |
| 2005/0117399 A1* | 6/2005 | Kwon et al. | 365/185.28 |
| 2006/0227618 A1* | 10/2006 | Lee | 365/185.22 |

FOREIGN PATENT DOCUMENTS

| | | |
|---|---|---|
| JP | 2001358313 A | 12/2001 |
| JP | 2004355793 A | 12/2004 |
| KR | 1020000059746 A | 10/2000 |

* cited by examiner

*Primary Examiner*—Vu A Le
(74) *Attorney, Agent, or Firm*—Volentine & Whitt, PLLC

(57) ABSTRACT

A flash memory device is disclosed and includes a memory cell array comprising memory cells arranged in rows and columns, a page buffer circuit having a single latch structure and configured to read data from a selected page in the memory cell array, and a controller controlling the page buffer circuit to detect memory cells having an improper voltage distribution causes by charge leakage within the selected page.

20 Claims, 9 Drawing Sheets

FLASH MEMORY DEVICE AND REFRESH METHOD

CROSS-REFERENCE TO RELATED APPLICATIONS

This U.S. non-provisional patent application claims priority under 35 U.S.C. § 119 of Korean Patent Application No. 2006-84263 filed on Sep. 1, 2006, the subject matter of which is hereby incorporated by reference.

BACKGROUND OF THE INVENTION

1. Field of the Invention

The present invention relates to semiconductor memory devices. More particularly, the invention relates to electrically erasable and programmable flash memory devices.

2. Description of the Related Art

Flash memory devices are one type of nonvolatile memory and more particularly, one type of electrically erasable and programmable read-only memory (EEPROM). In this type of memory, data may be written to a number of memory blocks during a single programming operation, and data may be erased from one memory block during a single erase operation As a result of these capabilities, flash memory is particularly useful in systems requiring rapid and effective read/programming operation, and systems that copy blocks of data from one memory section to another memory section. However, like all forms of EEPROM, flash memory incorporates a memory cell structure having one or more material films insulating a charge storage element. Such insulating films tend to break down with repeated use of the memory cell and may ultimately fail.

Like all nonvolatile memories, flash memory is able to retain stored data without power being constantly supplied. In addition, flash memory exhibits excellent resistance to mechanical shocks, good power consumption characteristics, and fast data access during read operations. With such features, flash memory has been widely incorporated as the data storage component of many contemporary electronic devices, particularly those running off batteries, such as cellular phones, personal digital assistants (PDA), digital cameras, portable gaming consoles, and MP3 players. Further, flash memory devices are widely employed as code storage elements in host devices such as high-definition TVs, digital versatile disks (DVDs), routers, and global positioning systems (GPSs).

Flash memory is generally available in two types: NOR and NAND. These designations are drawn from the logical arrangement of gates within the respective flash memory types. Contemporary flash memory devices may further be categorized as single data bit per memory cell or multi-bit per memory cell devices Regardless of logical gate type or data bit per memory cell capabilities, all flash memory incorporates a floating gate element storing charge indicative of data state. An important consideration relative to this element is its reliability under operating stress (or operating endurance). That is, the number of programming/erasing cycles that may be performed on a flash memory cell before degradation of its data retention characteristics is an important quality metric.

Stored charge (e.g., electrons) may leak from a floating gate due to a number of mechanisms, including the emission of thermions, charge diffusion, drift due to ionic impurities, stress under programming disturbances, etc. As the charge leakage from a floating gate varies, the operating threshold voltage for the memory cell will change. Similarly, charge migration from an associated control gate to the floating gate results in a change to the threshold voltage. These potential changes to threshold voltage are directly related to the insulating quality of films associated with the floating gate.

Unfortunately, repetitive programming/erasing cycles stress the insulating film(s) (e.g., oxides) associated with the floating gate, and the threshold voltage of unit memory cells may gradually change (e.g., be reduced) over time. As indicated by the broken line in Figure (FIG.) 1, the distribution profile for a programmed memory cell may shift to a lower voltage level. In some instances, memory cells having a shifted distribution profile (see, shaded region of FIG. 1) may actual exhibit a threshold voltage lower than a defined program-verifying voltage Such a circumstance will result in a read fail due to a decrease in read margin relative to the threshold voltage.

SUMMARY OF THE INVENTION

In one embodiment, the invention provides a flash memory device comprising; a memory cell array comprising memory cells arranged in rows and columns, a page buffer circuit having a single latch structure and configured to read data from a selected page in the memory cell array, and a controller controlling the page buffer circuit to detect memory cells having an improper voltage distribution causes by charge leakage within the selected page.

In another embodiment, the invention provides a memory system comprising; a flash memory device comprising a memory cell array comprising a plurality of memory blocks and having a data storage field storing refresh data relevant to the plurality of memory blocks, and a memory controller generating a refresh command in accordance with the refresh data upon power-up.

In another embodiment, the invention provides a flash memory device comprising; a memory cell array comprising a plurality of memory blocks and storing refresh data and a refresh address, a page buffer circuit configured to read data from a selected page of the memory cell array, and a controller operating to control the page buffer circuit to read data from the selected page, wherein the refresh address is loaded to the controller upon power-up and the controller controls a refresh operation directed to the memory cells of the selected page in relation to the loaded refresh address.

DESCRIPTION OF EMBODIMENTS

Figure 1:
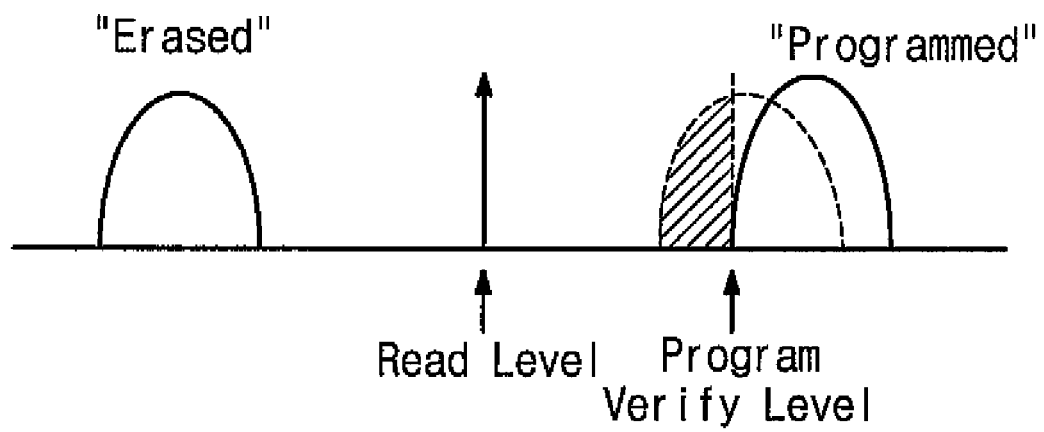
FIG. 1 is a graphic diagram showing a variation of threshold voltage distribution caused by charge loss.

Embodiments of the invention will now be described with reference to the accompanying drawings. The invention may, however, be embodied in different forms and should not be constructed as being limited to only the illustrated embodiments. Rather, the embodiments are provided as teaching examples. Throughout the drawings and written description, like reference numerals refer to like or similar elements.

Figure 2:
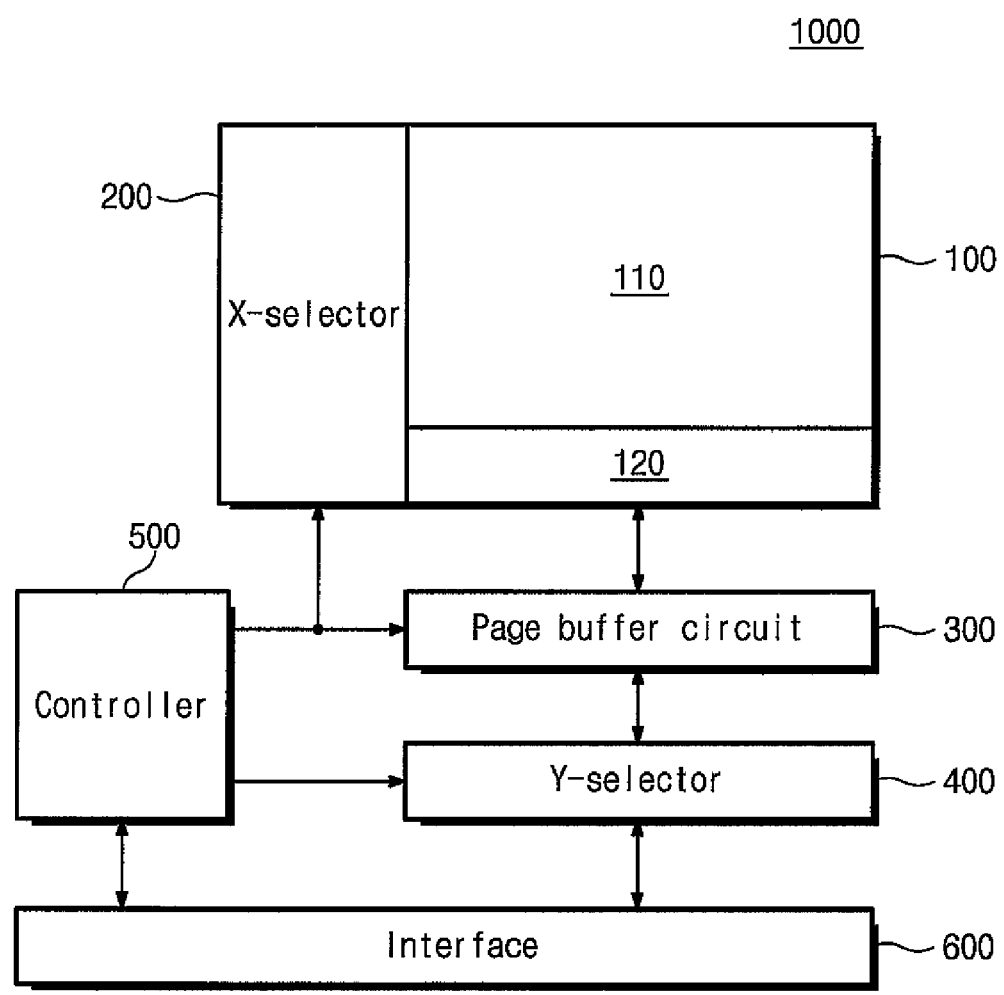
FIG. 2 is a block diagram of a flash memory device according to an embodiment of the invention.

FIG. 2 is a block diagram illustrating a flash memory device in accordance with an embodiment of the invention. For purposes of the explanation that follows, the flash memory device will be assumed to be a NAND flash memory device, but other embodiments of the invention include other types of memory devices (e.g., MROM, PROM, FRAM, NOR flash, etc.).

Referring to FIG. 2, flash memory device 1000 comprises a memory cell array 100 storing N-bit data per memory cell, where N is a positive integer. Memory cell array 100 may be segmented into first and second storage fields 110 and 120. Each of the first and second storage fields 110 and 120 comprises a plurality of memory blocks. Each memory block is organized around multiple strings of conventional memory cells having a NAND structure. Exemplarily structures for each memory block are disclosed in U.S. Pat. Nos. 5,696,717; 6,058,048; 6,813,184; and 6,930,919, the collective subject matter of which is hereby incorporated by reference.

First storage field 110 may be used to store information such as code data and normal data. Second storage field 120 may be used to store operating information such as refresh data (or reprogramming data) relevant to certain internal housekeeping chores associated with the memory blocks of first storage field 110. Refresh data indicates whether or not each memory block (or each memory page) in first storage field 110 has been programmed, program timing for each memory block (or memory page), and identifying information for each memory block (or memory page).

As illustrated in FIG. 2, flash memory device 1000 also comprises of a row selector (X-selector) 200, a page buffer circuit 300, a column selector (Y-selector) 400, a controller 500, and an interface block 600.

Row selector 200 operates under the control of signals generated by controller 500 and selects at least one of row (or page) within memory cell array 100. The selected row (or page) is driven by a word line voltage provide by row selector 200. Row selector 200, as further described in the previously incorporated references, may select a predetermined memory block (or memory page) upon power-up.

Page buffer circuit 300 is configured to read/write data from/into memory cell array 100 under the control of controller 500. Page buffer circuit 300 may comprise a plurality of individual page buffers corresponding to each columns (or corresponding to one or more bit lines) of memory cell array 100. In one embodiment, page buffer circuit 300 comprises a plurality of page buffers corresponding to paired bit lines. Each page buffer may be configured to read/program one or more data bits per operation. The structure of page buffer circuit 300 will vary by design and is deemed to be well within the scope of ordinary skill in the art. However, in one embodiment, each one of a plurality of page buffers forming page buffer circuit 300 is configured to read/programming M-bit data, where M is an integer equal to or larger than 3.

Column selector 400 may be configured to select a page buffer within page buffer circuit 300 as indicated by controller 500. Controller 500 may be configured to maintain or store timing information which may be communicated to memory cell array 100 upon power-up. In this regard, a current time indication may be provided by an external system (e.g., a memory controller or a computer system).

Interface block 600 may be configured to interface with an external system (e.g., a memory controller or a host). In the illustrated embodiment, interface block 600 is assumed to include a buffer for a dual buffering operation and competent conventional components to control the dual buffering operation.

Flash memory device 1000 may be configured to support a refresh operation. The refresh operation is used to compensate for a reduction in memory cell threshold voltages due to charge leakage from the constituent floating gates. As a result of the refresh operation, the threshold voltage of memory cells forming memory cell array 100 may be maintained at a level greater than or equal to a defined program-verifying voltage. This result enhances the data retention characteristics of flash memory device 1000 and improves overall reliability.

Figure 3:
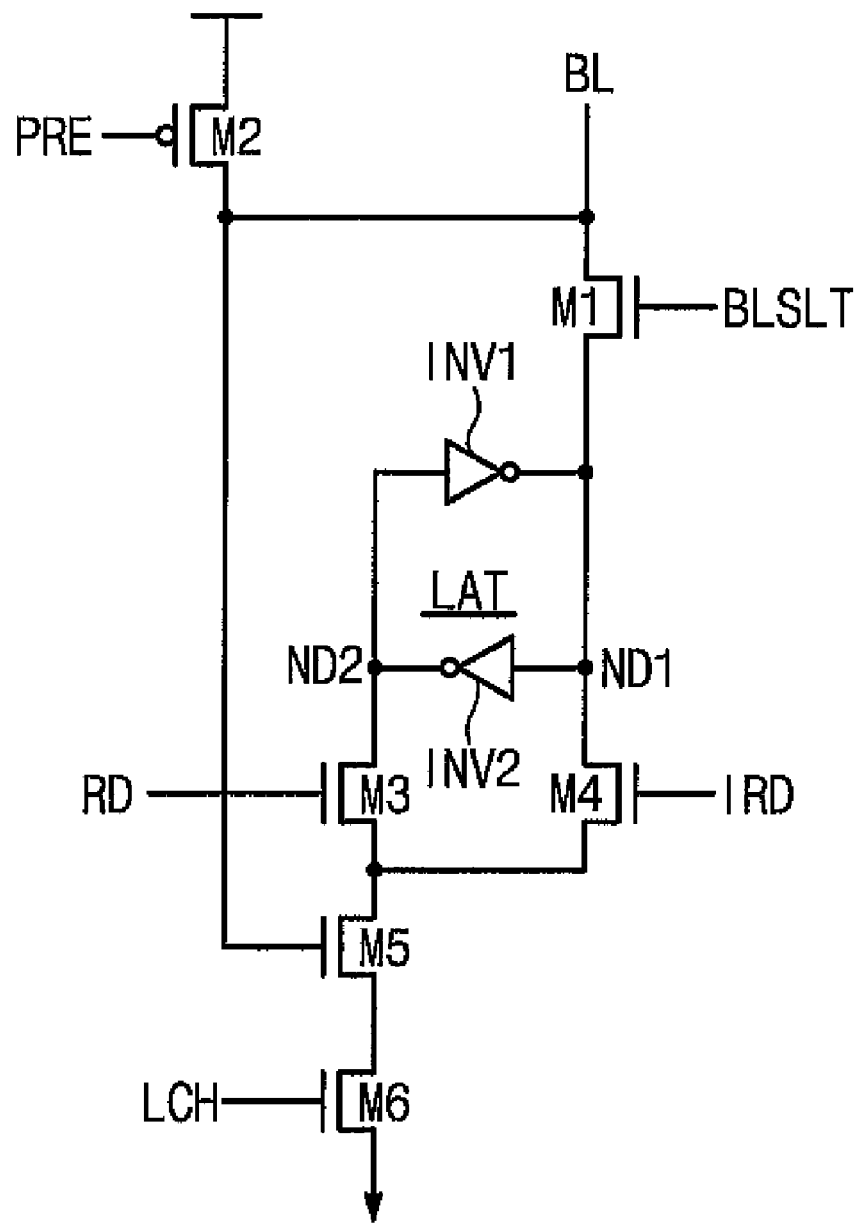
FIG. 3 is a block diagram of a page buffer circuit according to an embodiment of the invention.

FIG. 3 is a block diagram of exemplary page buffer circuit 300 adapted for use within an embodiment of the invention. While FIG. 3 shows only a single page buffer PB as an example, a plurality of such circuits may be grouped in parallel operation to form page buffer circuit 300. Referring to FIG. 3, page buffer PB is formed of NMOS transistors M1 and M3~M6, PMOS transistors M2, and inverters INV1 and INV2. Those of ordinary skill in the art will recognize that this particular structure is merely exemplary and that the invention is not restricted to only this structure.

Figure 4:
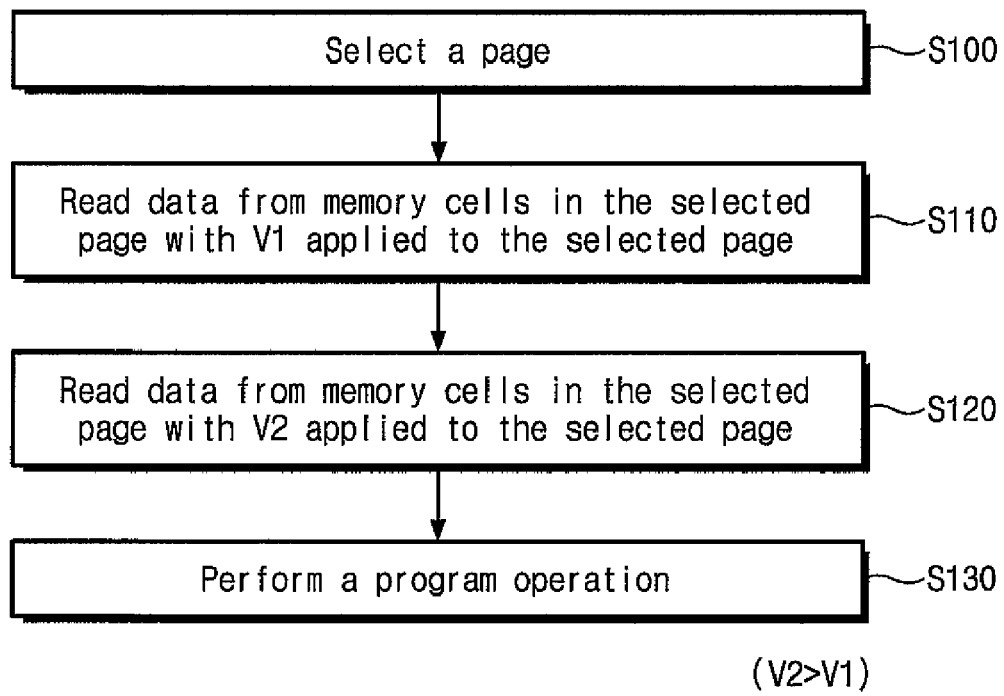
FIG. 4 is a flow chart summarizing a refresh operation for a flash memory device according to an embodiment of the invention.
Figure 5:
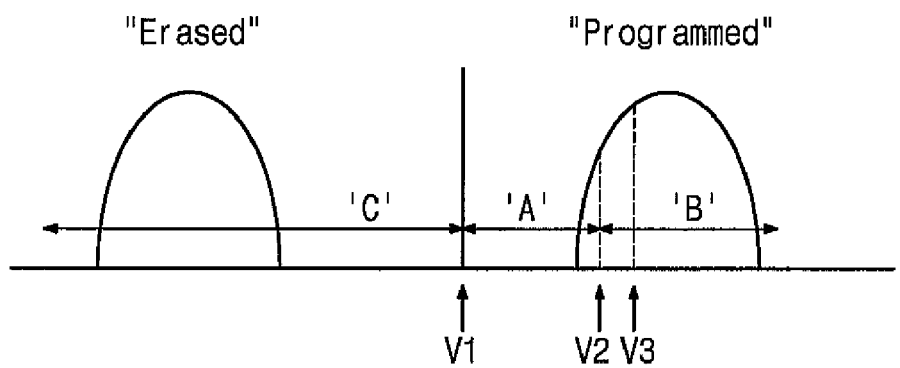
FIG. 5 is a graphic diagram showing voltages applied to a selected page during a refresh operation of the flash memory device according to an embodiment of the invention.
Figure 6:
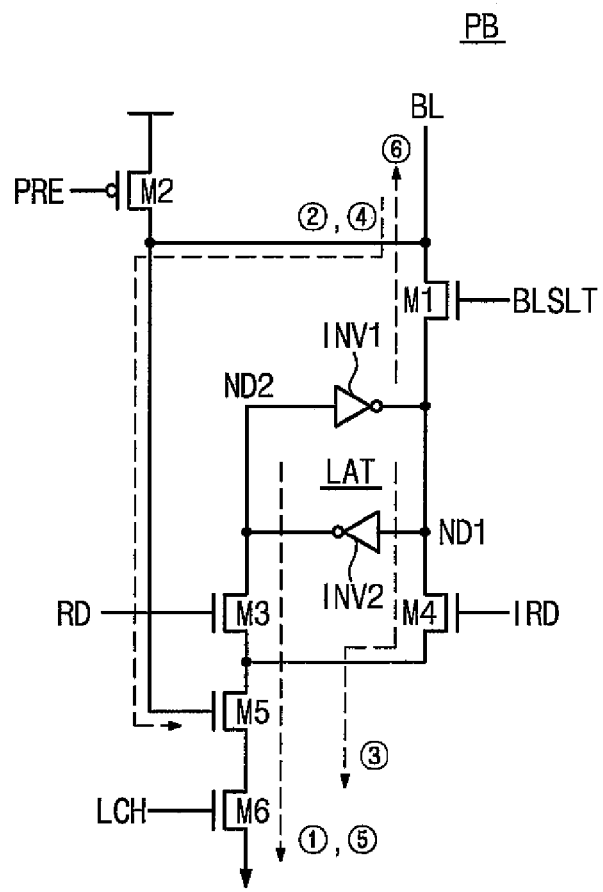
FIG. 6 is a circuit diagram illustrating charge flow during a refresh operation for a flash memory device according to an embodiment of the invention.

FIG. 4 is a flow chart summarizing a refresh operation for a flash memory device according to an embodiment of the invention. FIG. 5 is a graphic diagram showing voltages applied toga selected page during the refresh operation of FIG. 4, and FIG. 6 is a diagram illustrating current (or charge flow) indicative of a data during the refresh operation conducted using the page buffer of FIG. 3. With collective reference to these drawings, an exemplary refresh operation for a flash memory device according to an embodiment of the invention will be described. For clarity of description, the refresh operation will be explained with reference to only a single page buffer within page buffer circuit 300.

Initially, a page (or word line) of a memory block is selected by row selector 200 under the control controller 500 (S100). Next, data is read from memory cells of the selected page while applying a first voltage V1 (see, FIG. 5) to the selected page (S110). This step is referred to as hereafter as the 'first read operation'.

With reference to the exemplary page buffer PB of FIG. 6, a latch LAT of the page buffer PB is initiated. This operation will result from receipt of an address associated with the selected page and internally by flash memory device 1000 or provided by an external system (e.g., a memory controller or computing system). This is accomplished by forming a signal path one. (Signal paths one through six are indicated in FIG. 6 by corresponding numbered circles). Signal path one is formed by turning ON NMOS transistors M3, M5, and M6 and a PMOS transistor M2. As a result of this initialization, a node ND1 of latch LAT is "set" (i.e., a voltage is established indicating a logic value of '1') and a node ND2 of latch LAT is "reset" (i.e., a voltage is established indicating a logic value of '0').

Next, a sensing current is supplied to a bit line BL as the first voltage V1 is applied to selected page or word line. If a memory cell has an erased state (i.e., it has a threshold voltage lower than the first voltage V1, as indicated by region "C" in FIG. 5 ), the voltage on the bit line BL falls to ground. In contrast, if the memory cell has a non-erased state (i.e., it has a threshold voltage greater than the first voltage V1, as indicated by regions "A" and "B" of FIG. 5), the voltage on the bit line BL rises up to the power source voltage. The voltage on the bit line BL indicating the programmed state of the memory cell is stored in the latch LAT via signal paths two and three. For instance, in the former case, signal path three is not complete since NMOS transistor M5 is turned OFF. Under these conditions, nodes ND1 and ND2 are maintained in their initial states (i.e., ND1 is "high" and ND2 is "low"). In the latter case, signal path three is complete since NMOS transistor M5 is turned ON. Under these conditions, the voltage conditions apparent at nodes ND1 and ND2 are defined to as low and high, respectively.

Referring now to FIGS. 4 and 5, data is next read from memory cells of the selected page as a second voltage V2 is applied to the selected page (S120). This step is referred to as the 'second read operation'.

As the second read operation begins, the sensing current is supplied to the bit line BL under a condition where the second voltage V2—higher than the first voltage V1—is applied to the selected page or word line. Here, the second voltage V2 while higher than the first voltage V1 will be less than or equal to a defined program-verifying voltage V3. In the illustrated embodiments, it is assumed that the second voltage V2 is higher than the first voltage V1 but lower than the program-verifying voltage V3. The voltage difference between the second voltage V2 and the program-verifying voltage V3 will vary in view of the desired retention characteristics of the memory cells forming first storage field 110.

If a memory cell has a threshold voltage lower than the second voltage V2, the voltage on the bit line BL becomes lower than the ground. In such a case, the memory cell is in an erased state (region "C" of FIG. 5) or it possesses a threshold voltage between the first and second voltages V1 and V2 (region "A" of FIG. 5). Under these conditions, the voltage on the bit line BL, (i.e., the voltage indicating a programming state for the memory cell) is stored in the latch LAT via signal paths four and five. For instance, in the former case, signal path five is not complete because NMOS transistor M5 is turned OFF. Thus, for a memory cell having a voltage distribution in region "A" of FIG. 5, nodes ND1 and ND2 will be maintained in a state established by the first read operation (i.e., ND1 is low, and ND2 is high). However, for a memory cell having a voltage distribution greater than the second voltage V2 (i.e., within region B of FIG. 5), the voltage on the bit line BL will rise to the level of the power source voltage. Alternately, signal path five is complete when NMOS transistor M5 is turned ON. Thus, nodes ND1 and ND2 are set to their initial states (i.e., ND1 is high, and ND2 is low).

Following the first and second read operations, a memory cell having a voltage distribution in region "A" of FIG. 5 may be detected. Such a detected memory cell may then be refreshed by controller 500 in accordance with data stored in the page buffer PB (S130). During the refresh operation, the bit line BL may be charged to ground or to the power source voltage via signal path five in accordance with data stored in the latch LAT. As is well known in the art, the memory cell may be programmed when the bit line BL is set to ground, while such programming may be inhibited when the bit line BL is set to the power source voltage. Thus, in FIG. 6, only a memory cell connected to the page buffer PB where the node ND1 is set on logic '0' is programmed. The refresh operation may be carried out through a copy-back programming mode or reprogramming mode. In the copy-back programming mode, read data is programmed in a memory cell of another page. In the reprogramming mode, read data is reprogrammed in a memory cell of a selected page.

As can be seen from the above explanation, a flash memory device according to an embodiment of the invention is able to detect a memory cell having an improper voltage distribution using only a single latch. This single latch enables a refresh operation directed to the detected memory cell.

Figure 7:
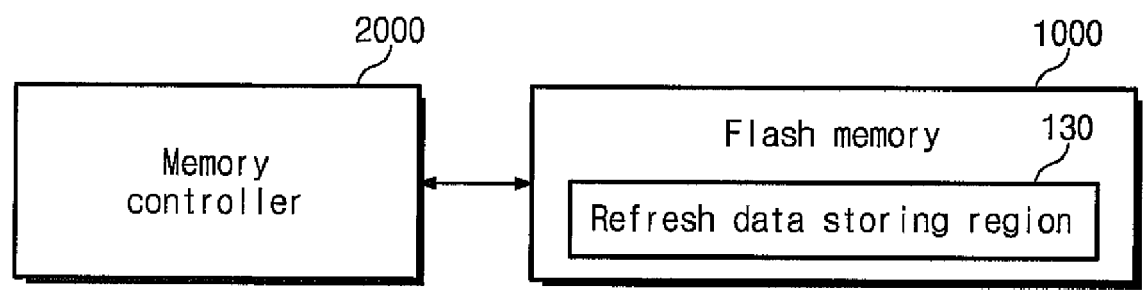
FIG. 7 is a general block diagram of a memory system including a flash memory device according to an embodiment of the invention.

FIG. 7 is a block diagram of a memory system including the flash memory device according to an embodiment of the invention.

Referring to FIG. 7, memory system includes the flash memory device 1000 and memory controller 2000. Flash memory device 1000 may be substantially identical to the device shown in FIG. 2 in structure and operation, and so will not be described in any additional detail. Memory controller 2000 may be configured to read refresh data stored in a refresh data storage field 130 of flash memory device 1000, and generate a refresh command in relation to the read refresh data. In one embodiment, refresh data storage field 130 may be contained in second storage field 120 of FIG. 2. Thus, the refresh data may include timing information related to programming of the constituent memory blocks.

Alternately, memory controller 2000 may be configured to manage programming/erasing cycles in accordance with an empirically defined "wear level" indicator. In this context, the programming/erasing cycles represent the number of programming/erasing times for each memory block. As is well known by those skilled in this art, the information indicating the programming/erasing cycles may be stored in memory cell array 100 of flash memory device 1000. Use of a wear level indicator prevents programming/erasing operation from being concentrating (i.e., repeatedly directed to) several memory blocks. Thus, reference to the wear level indicator allows programming/erasing operations to be uniformly carried out over all of the available memory blocks. Thus, some embodiments of the invention, instead of defining the operations of memory controller 2000 in relation to a refresh command generated from timing information, may define the operations of memory controller 2000 by generating the refresh command with reference to additional information regarding the programming/erasing cycles including, as an example, a wear level indicator.

Figure 8:
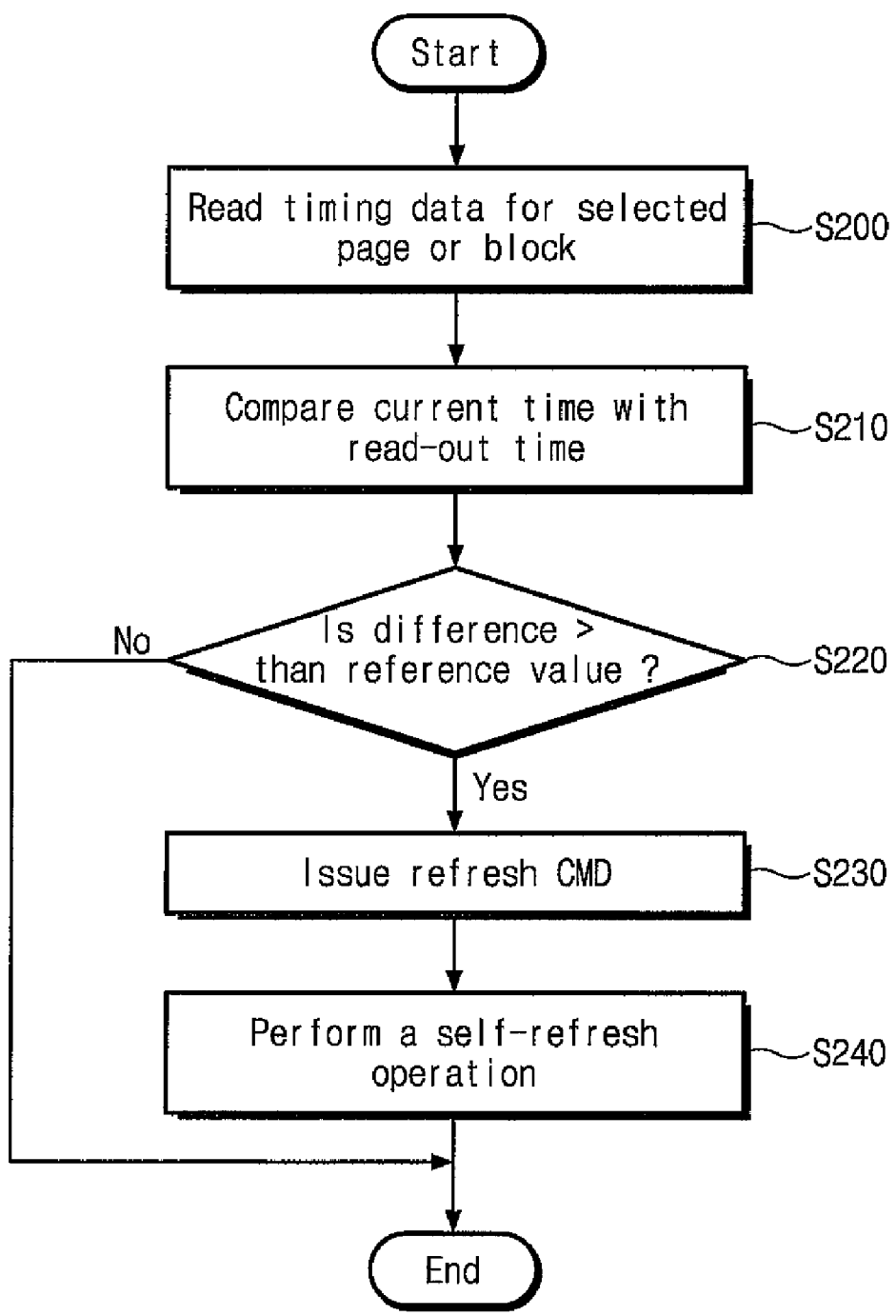
FIG. 8 is a flow chart summarizing an operation generating a refresh command in the memory system according to am embodiment of the invention.

FIG. 8 is a flow chart summarizing an operation generating a refresh command for a flash memory system according to an embodiment of the invention.

First, memory controller 2000 reads refresh data (e.g., timing information stored in second storage field 120, potentially including a defined refresh data storage field 130) for flash memory device 1000 (S200). Memory controller 2000 then compares a timing data associated with the refresh data with a current time (S210). The read refresh data may include information related to individual memory blocks or memory pages. Memory controller 2000 then determines whether the difference between the timing information related to the refresh data and a current timing indication is greater than a reference value (S220). Here, the reference value may be established to guarantee adequate refresh timing for the flash memory device 1000.

If the time difference is less than the reference value, the method terminates. In contrast, if the difference is greater than the reference value, memory controller 2000 generates a refresh command (CMD) to flash memory device 1000 (S230). The refresh command may include information regarding the memory block or memory page to be refreshed. Flash memory device 1000 then executes the received refresh operation (S240).

As stated above, the refresh operation may be carried out in one of the copy-back programming mode or reprogramming mode. With the copy-back programming mode, in the step S230, the memory controller 2000 outputs information about target and destination addresses to the flash memory device 1000 along with the refresh command With the reprogramming mode, in the step S230, the memory controller 2000 outputs the refresh command to the flash memory device 1000 along with target address information (or start and end address information for selecting plural pages in sequence).

In exemplary embodiments by the present invention, the operation shown in FIG. 8 may be conducted at a power-up time. In this case, there is a need of a reference time to be compared with the time of the refresh data provided from the flash memory device 1000. Such a reference time may be provided from the flash memory device 1000. For instance, as aforementioned, the controller 500 of the flash memory device 1000 is able to store data of a power-up time in the memory cell array 100. The data of power-up time is provided to the memory controller 2000 as a reference time at the power-up time. The memory controller 2000 generates the refresh command from comparing the time of the refresh data with the reference time.

Figure 9:
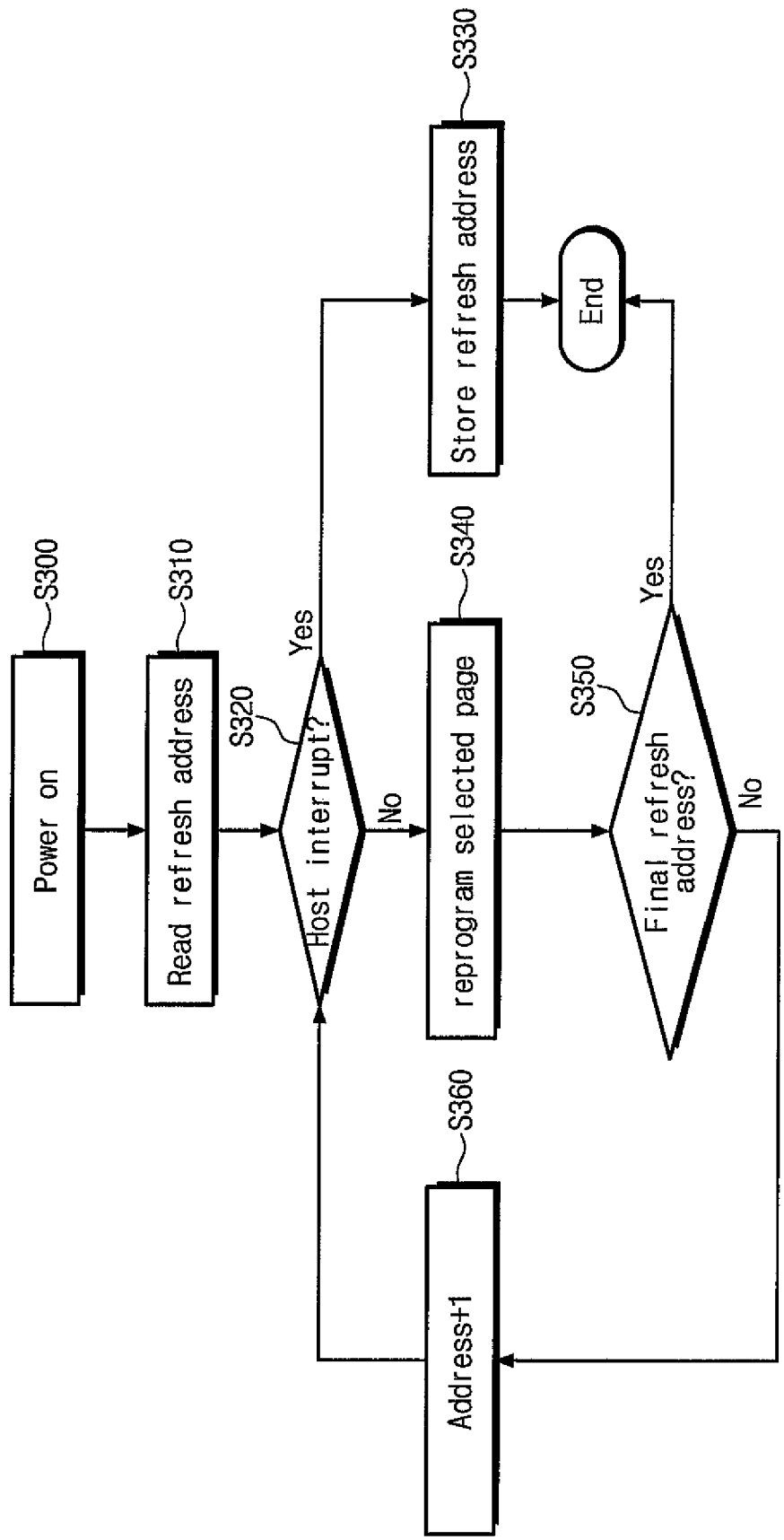
FIG. 9 is a flow chart summarizing another refresh operation for a flash memory device according to an embodiment of the invention.

FIG. 9 is a flow chart summarizing another refresh method for a flash memory device according to an embodiment of the present invention.

Different from the method shown in FIG. 8, this refresh method may be automatically carried out upon power-up. The refresh operation at power-up is carried out in the manner that scans pages of memory cell array 100.

As power is supplied to flash memory device 1000 (S300), page buffer circuit 300 reads a refresh address from memory cell array 100 and provides it to controller 500 through column selector 400. Here, the refresh address may be stored in second storage field 120, (i.e., the refresh data storage field). The refresh address may be also stored in first storage field 110. Otherwise, although not shown, a storage field with nonvolatile characteristic may be provided to flash memory device 1000 and the refresh address may be stored in such a nonvolatile storage field. One example of a possible power-up read operation is disclosed in U.S. Pat. No. 6,058,048, the subject matter of which is hereby incorporated by reference.

Next, controller 500 determines whether an interrupt has occurred (S320). If an interrupt has occurred (e.g., there is a request for a reading, programming, or erasing operation from the memory controller), controller 500 controls row selector 200, column selector 400, and page buffer circuit 300 to store the refresh address in memory cell array 100 (S330). Thereafter, the method is terminated.

In contrast, if controller 500 determines that no interrupt has occurred, a page corresponding to the read refresh address is selected by controller 500. Then, the refresh operation is carried out for memory cells of the selected page (e.g., a first page of memory cell array 100) (S340). This refresh operation is substantially the same as that explained in relation to FIG. 4, and so will not be described in additional detail. After completing the refresh operation for the selected page, controller 500 determines if the refresh address of the selected page is a "last page" address (i.e., an address indicating a last page of memory cell array 100) (S350). If so, the method is terminated. If not, controller 500 increments the refresh address and returns to step S320.

As can be seen from the above explanation, a flash memory device according to an embodiment of the invention may be configured to select pages of memory cell array 100 in sequence and to execute a refresh operation for the selected page. If an interrupt occurs during the refresh operation, the refresh address of the selected page may be stored in memory cell array 100 by controller 500. The stored refresh address may be used as a starting address for the refresh operation upon next power-up.

Figure 10:
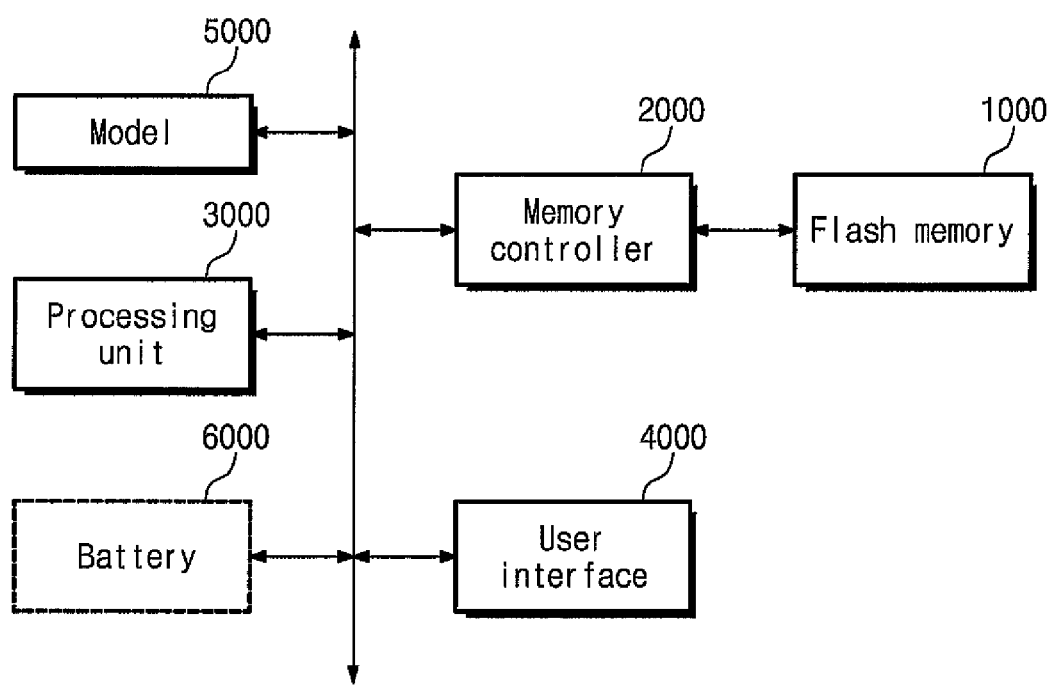
FIG. 10 is a general block diagram of a computational system including a flash memory device according to an embodiment of the invention.

FIG. 10 is a general block diagram of a computation system including the flash memory device according to an embodiment of the invention. The computing system may be organized to include a processing unit 3000 such as a microprocessor or a central processing unit (CPU), a user interface 4000, a modem 5000 such as a baseband chipset, memory controller 2000, and flash memory device 1000.

Flash memory device 1000 and memory controller 2000 may be configured as above. That is, flash memory device 1000 may be used in conjunction with memory controller 2000 to store N-bit data, wherein N is a positive integer processed or to be processed by processing unit 3000. If the computational system of FIG. 10 is a mobile apparatus, it may further comprise of a battery 6000 for supplying power.

As described above, in a flash memory device according to an embodiment of the invention, it is possible to detect a memory cell with an improper voltage distribution due to charge loss using a page buffer employing a single latch. It is also possible to conduct a refresh operation which detects such a memory cell using the page buffer with a single latch. Moreover, reprogramming of the memory cell through a refresh operation allows improvement in the overall reliability of the flash memory device.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
   a memory cell array comprising memory cells arranged in rows and columns;
   a page buffer circuit having a single latch structure and configured to read data from a selected page in the memory cell array; and
   a controller controlling the page buffer circuit to detect memory cells having an improper voltage distribution caused by charge leakage within the selected page.

2. The flash memory device of claim 1, wherein the controller detects memory cells having an improper voltage distribution by applying a first word line voltage to the selected page and reading data, and then applying a second word line voltage to the selected page and reading data.

3. The flash memory device of claim 2, wherein the controller controls the page buffer circuit to program the detected memory cells in accordance with data read by the page buffer circuit.

4. The flash memory device of claim 2, wherein the first word line voltage is less than the second word line voltage.

5. The flash memory device of claim 4, wherein the second word line voltage is less than or equal to a program-verifying voltage.

6. The flash memory device of claim 1, wherein the memory cell array comprises:

first and second storage fields, each comprising a plurality of memory blocks, and wherein the second storage field stores refresh data related to the plurality of memory blocks in the first storage field.

7. The flash memory device of claim 3, wherein data stored in the page buffer circuit is programmed via a copy-back programming mode or a reprogramming mode.

8. The flash memory device of claim 1, wherein the controller provides a current time indication to the memory cell array upon power-up.

9. A memory system comprising:

a flash memory device comprising a memory cell array comprising a plurality of memory blocks and having a data storage field storing refresh data relevant to the plurality of memory blocks; and a memory controller generating a refresh command in accordance with the refresh data upon power-up.

10. The memory system of claim 9, wherein the flash memory device has a single latch structure and further comprises:

a page buffer circuit reading data from a selected memory page in the memory cell array; and a controller controlling the page buffer circuit to detect memory cells having an improper voltage distribution caused by charge leakage within the selected page.

11. The memory system of claim 10, wherein the controller provides a current time indication to the memory cell array upon power-up.

12. The memory system of claim 11, wherein timing data related to the selected page is provided to the memory controller upon power-up.

13. The memory system of claim 12, wherein the memory controller generates a refresh command with reference to a time difference between a current time and timing data included in the refresh data with reference to a reference value.

14. The memory system of claim 13, wherein the reference value is shorter than a time sufficient to ensure refresh of the plurality of memory blocks.

15. The memory system of claim 9, wherein the memory controller is configured to manage programming/erasing cycles for the memory cell array in relation to a wear level indicator, and to generate the refresh command in accordance with the refresh data and the programming/erasing cycles of the memory cell array.

16. A flash memory device comprising:

a memory cell array comprising a plurality of memory blocks and storing refresh data and a refresh address;

a page buffer circuit configured to read data from a selected page of the memory cell array; and a controller operating to control the page buffer circuit to read data from the selected page, wherein the refresh address is loaded to the controller upon power-up and the controller controls a refresh operation directed to the memory cells of the selected page in relation to the loaded refresh address.

17. The flash memory device of claim 16, wherein after completing the refresh operation for the memory cells of the selected page, the controller increments the refresh address to indicate a next page.

18. The flash memory device as set forth in claim 16, wherein if an interrupt occurs during the refresh operation, the controller stores the last refresh address in the memory cell array.

19. The flash memory device of claim 16, wherein the refresh operation is carried out via a copy-back programming mode or a reprogramming mode.

20. The flash memory device of claim 16, wherein the page buffer circuit is configured with a single latch structure.

* * * * *